(12) United States Patent
Hopkins et al.

(10) Patent No.: US 11,056,497 B2
(45) Date of Patent: Jul. 6, 2021

(54) MEMORY ARRAYS AND METHODS USED IN FORMING A MEMORY ARRAY

(71) Applicant: Micron Technology, inc., Boise, ID (US)

(72) Inventors: John D. Hopkins, Meridian, ID (US); Justin B. Dorhout, Boise, ID (US); Damir Fazil, Boise, ID (US); Nancy M. Lomeli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/407,504

(22) Filed: May 9, 2019

(65) Prior Publication Data

US 2020/0357809 A1 Nov. 12, 2020

(51) Int. Cl.
| | |
|---|---|
| *H01L 27/11556* | (2017.01) |
| *G11C 5/06* | (2006.01) |
| *H01L 27/11582* | (2017.01) |
| *H01L 27/1157* | (2017.01) |
| *H01L 27/11524* | (2017.01) |

(52) U.S. Cl.
CPC ........ *H01L 27/11556* (2013.01); *G11C 5/063* (2013.01); *H01L 27/1157* (2013.01); *H01L 27/11524* (2013.01); *H01L 27/11582* (2013.01)

(58) Field of Classification Search
CPC ........... H01L 27/11556; H01L 27/1157; H01L 27/11524; H01L 27/11582
See application file for complete search history.

(56) References Cited

U.S. PATENT DOCUMENTS

| | | | |
|---|---|---|---|
| 2011/0298013 A1 | 8/2011 | Hwang et al. | |
| 2015/0162345 A1* | 6/2015 | Lee | H01L 23/5226 438/268 |
| 2016/0118396 A1 | 4/2016 | Rabkin et al. | |
| 2017/0018555 A1 | 1/2017 | Kwan et al. | |
| 2018/0130814 A1* | 5/2018 | Lee | H01L 27/11568 |
| 2018/0219017 A1 | 8/2018 | Goda et al. | |
| 2019/0013404 A1 | 1/2019 | Carlson et al. | |
| 2019/0296041 A1* | 9/2019 | Yamasaka | H01L 27/1157 |

FOREIGN PATENT DOCUMENTS

| | | |
|---|---|---|
| KR | 10-2011-0133926 | 12/2011 |
| WO | WO PCT/US2020/026513 | 7/2020 |

\* cited by examiner

*Primary Examiner* — Selim U Ahmed
*Assistant Examiner* — Evan G Clinton
(74) *Attorney, Agent, or Firm* — Wells St. John P.S.

(57) ABSTRACT

A method used in forming a memory array comprises forming a conductive tier atop a substrate, with the conductive tier comprising openings therein. An insulator tier is formed atop the conductive tier and the insulator tier comprises insulator material that extends downwardly into the openings in the conductive tier. A stack comprising vertically-alternating insulative tiers and wordline tiers is formed above the insulator tier. Strings comprising channel material that extend through the insulative tiers and the wordline tiers are formed. The channel material of the strings is directly electrically coupled to conductive material in the conductive tier. Structure independent of method is disclosed.

29 Claims, 11 Drawing Sheets

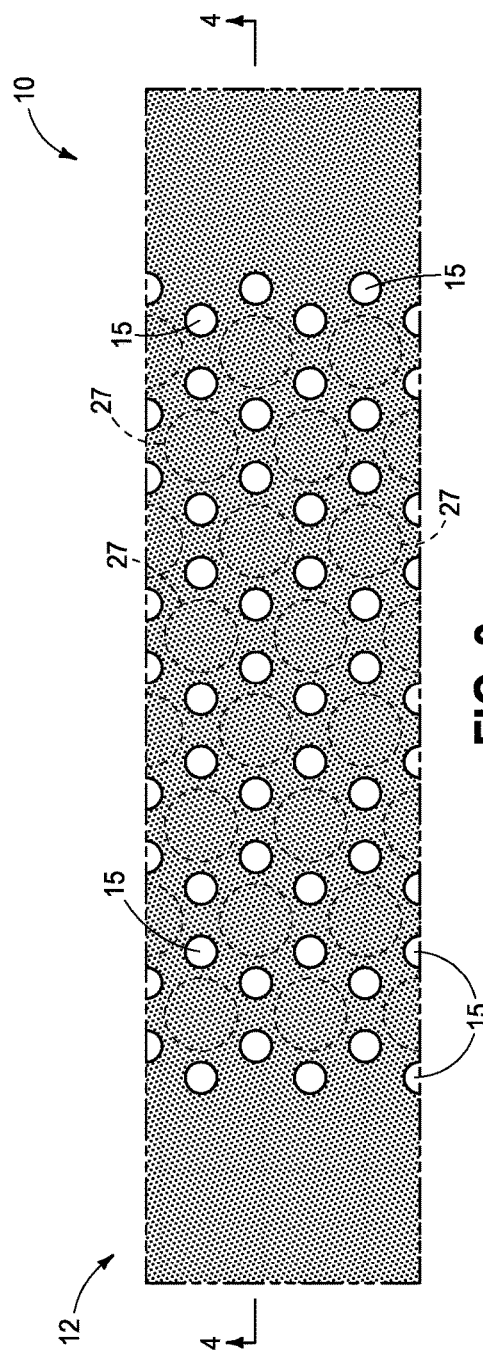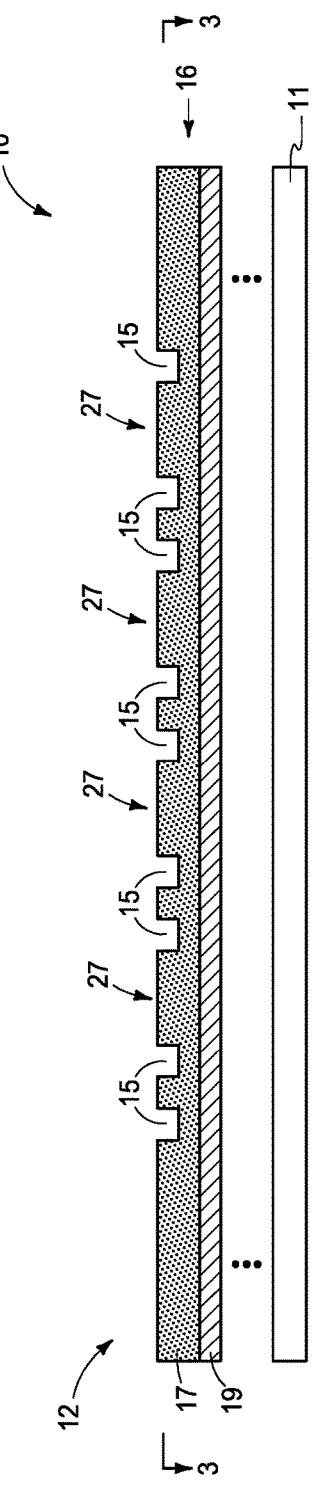

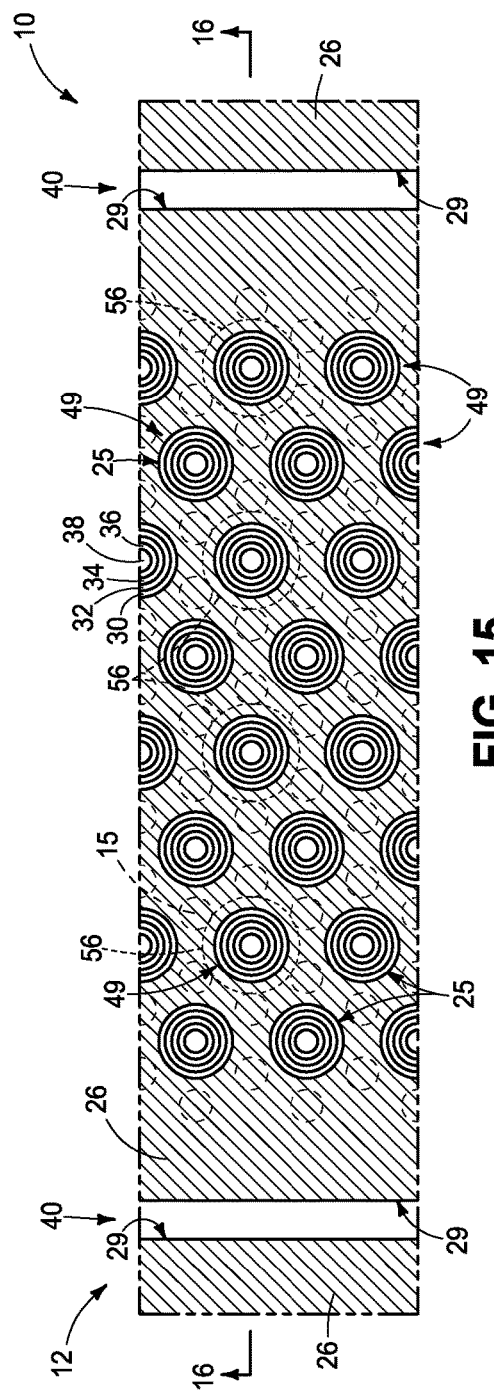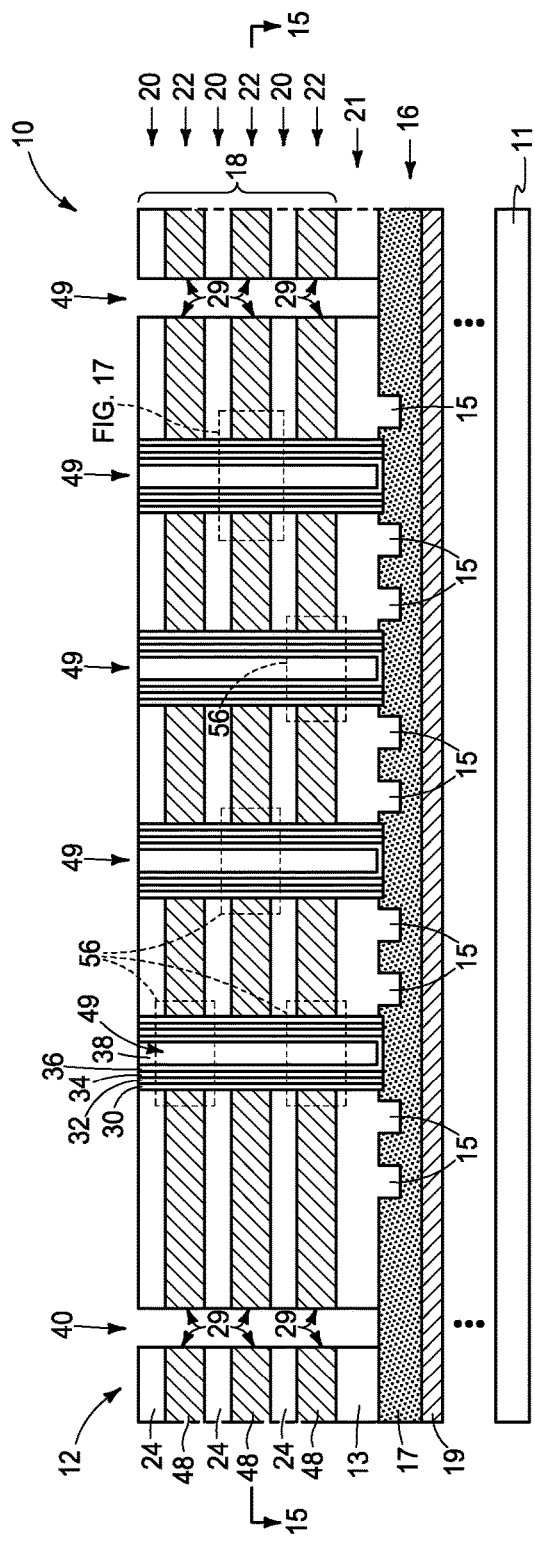

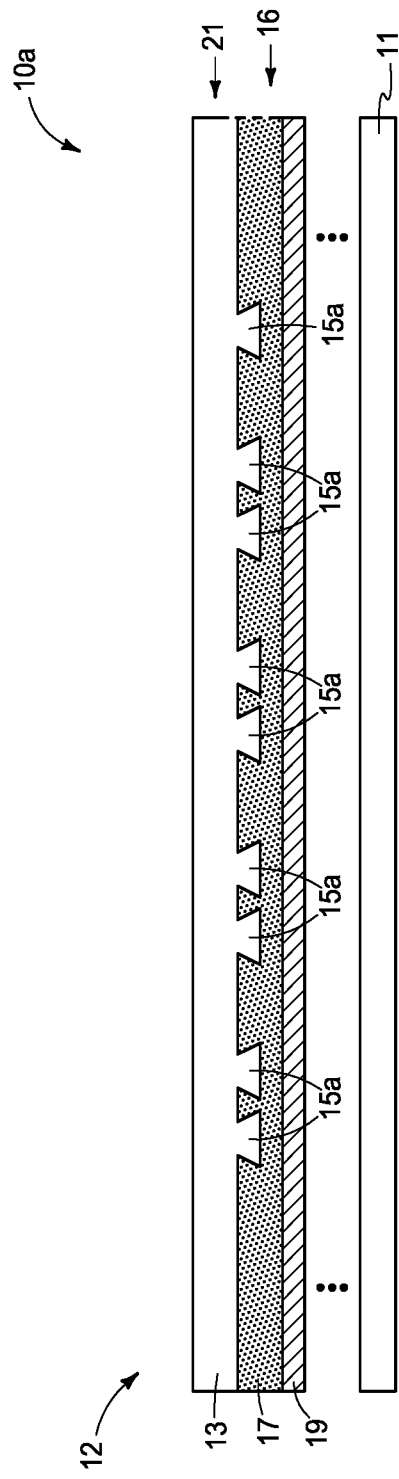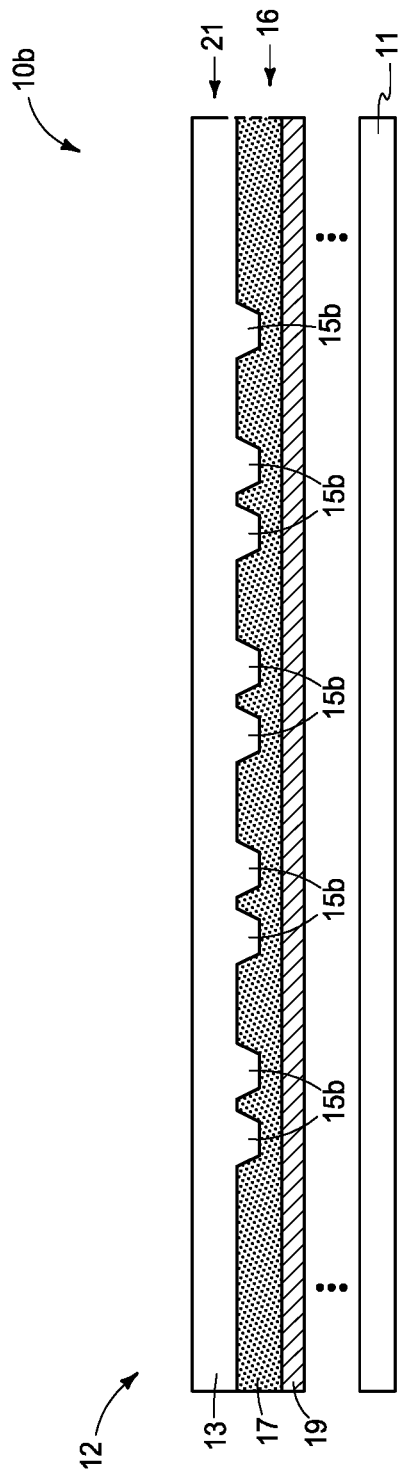

MEMORY ARRAYS AND METHODS USED IN FORMING A MEMORY ARRAY

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

BRIEF DESCRIPTION OF THE DRAWINGS

FIGS. 3-19 are diagrammatic sequential sectional and/or enlarged views of the construction of FIG. 1 in process in accordance with some embodiments of the invention.

FIGS. 20 and 21 are diagrammatic cross-sectional views of a portion of substrates in process in accordance with embodiments of the invention.

DETAILED DESCRIPTION OF EXAMPLE EMBODIMENTS

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-19 which may be considered as a "gate-last" or "replacement-gate" process.

Figure 1:
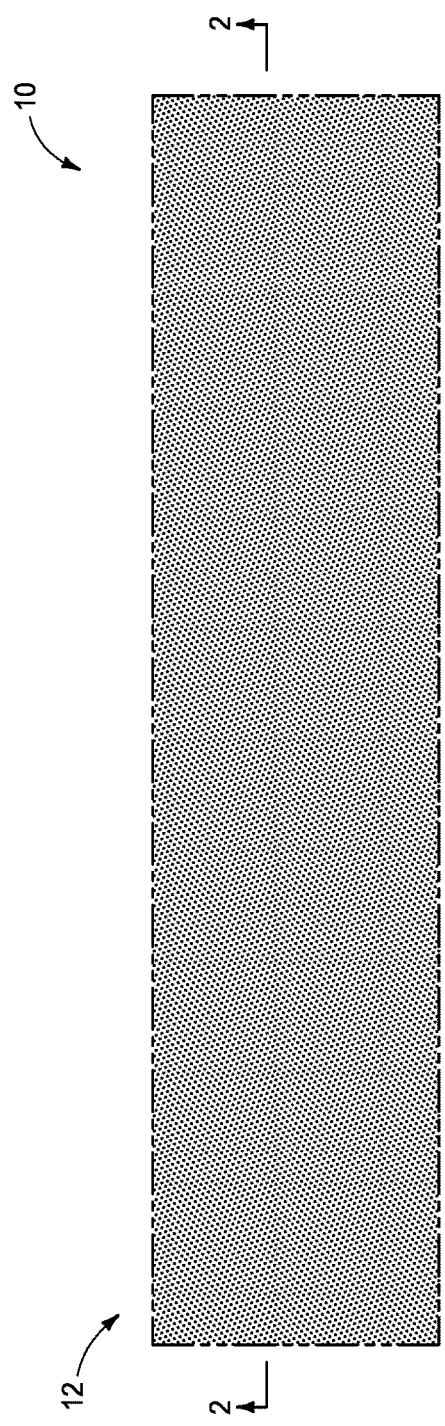
FIG. 1 is a diagrammatic cross-sectional view of a portion of a substrate in process in accordance with an embodiment of the invention and is taken through line 1-1 in FIG. 2.
Figure 2:
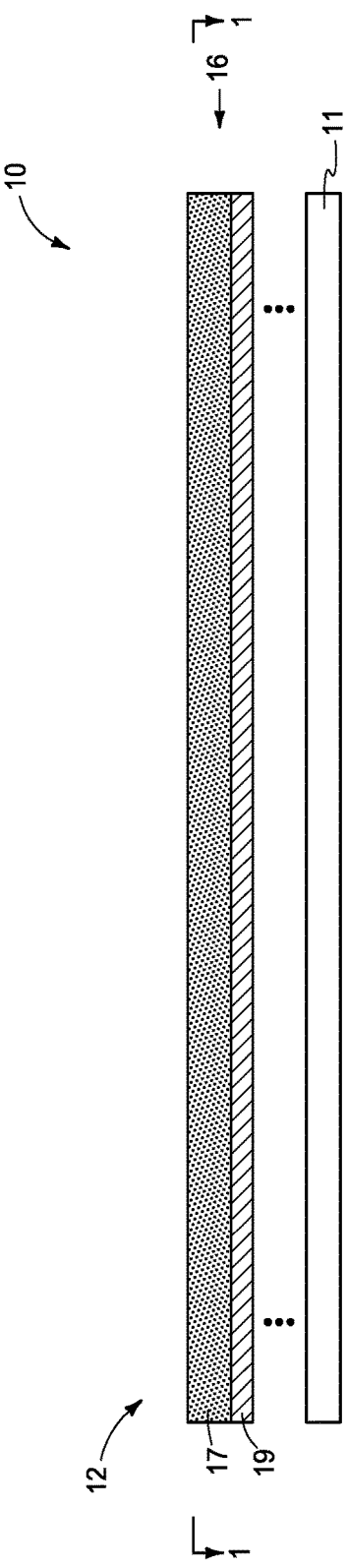
FIG. 2 is a diagrammatic cross-sectional view taken through line 2-2 in FIG. 1.

FIGS. 1 and 2 show a construction 10 comprising a base substrate 11 in a method of forming an array 12 of elevationally-extending strings of transistors and/or memory cells (not yet shown). Base substrate 11 has any one or more of conductive/conductor/conducting, semiconductive/semi-conductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Construction 10 comprises a conductive tier 16 that has been formed above substrate 11. Example conductive tier 16 is shown as comprising conductive material 17 (e.g., 2,000 Angstroms of conductively-doped semiconductive material such as conductively-doped polysilicon) above metal material 19 (e.g., 900 Angstroms and $WSi_x$). Conductive tier 16 may comprise part of control circuitry (e.g., peripheral-under-array circuitry and/or a common source line or plate) used to control read and write access to the transistors and/or memory cells that will be formed within array 12.

Referring to FIGS. 3 and 4, openings 15 have been formed in conductive tier 16 (e.g., by etching). In one embodiment, array 12 may be considered as comprising string locations 27 (e.g., memory cell string locations) wherein multiple of openings 15 are laterally outward of individual string locations 27. By way example only, string locations 27 are shown as being arranged in groups or columns of staggered rows of four locations 27 per row. Any alternating existing or future-developed arrangement and construction may be used. In one embodiment and as shown, multiple openings 15 surround individual string locations 27 and are at least three in number, in one such embodiment are at least four in number, in one such embodiment are at least six in number, and in one embodiment as shown are only six in number. In one embodiment relative to surround, such multiple openings 15 are shared by immediately-laterally-adjacent individual string locations 27 and in one embodiment are equally spaced around individual string locations 27. In some embodiments, openings 15 may be considered as being grouped around individual string locations 27 and may in such grouping have any of the arrangements described above and as shown.

Figure 5:
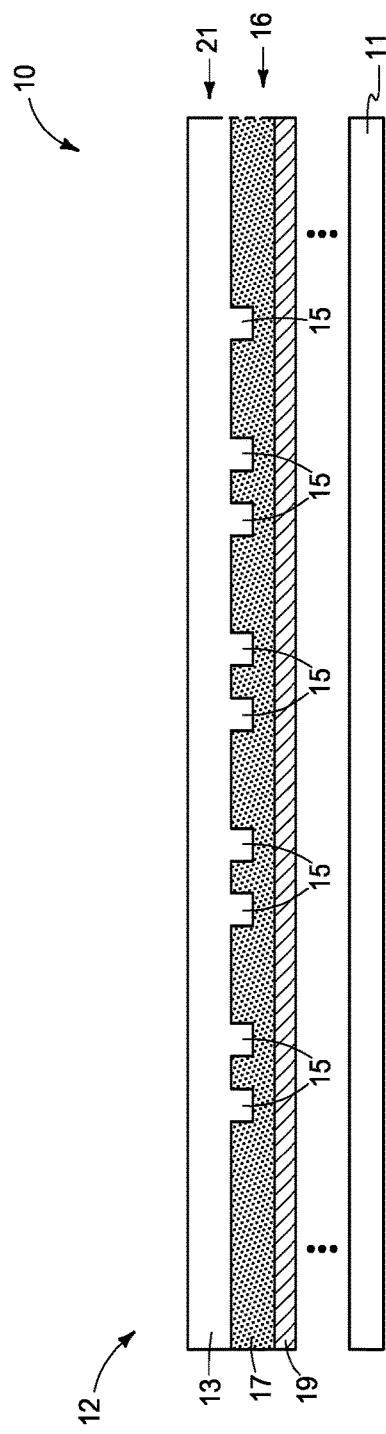

Referring to FIG. 5, an insulator tier 21 has been formed atop conductive tier 16 and comprises insulator material 13 that extends downwardly into openings 15 in conductive tier 16. Any insulative material may be used, with silicon dioxide being but one example. In one embodiment and as shown, insulator material 13 completely fills openings 15 in conductive tier 16. In one embodiment and as shown, openings 15 and insulator material 13 therein do not extend through conductive tier 16. In one such embodiment, openings 15 and insulator material 13 therein extend through no more than 50% of maximum thickness of conductive tier 16. In one embodiment, conductive tier 16 has a maximum thickness of greater than 600 Angstroms and openings 15 and insulator material 13 therein extend through no less than 600 Angstroms of conductive tier 16. In one embodiment, openings 15 and insulator material 13 therein extend through conductive tier 16 (not shown).

Figure 6:
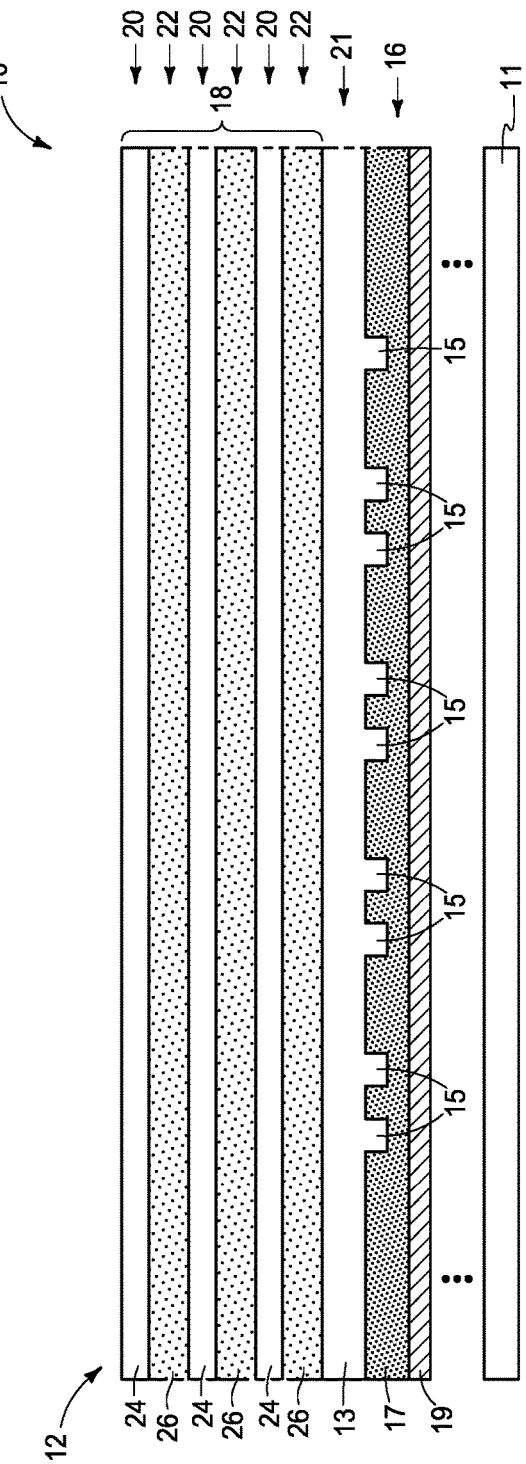

Referring to FIG. 6, a stack 18 comprising vertically-alternating insulative tiers 20 and wordline tiers 22 has been formed above insulator tier 21. Example thickness for each of tiers 20 and 22 is 25 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductive tier 16 and stack 18. For example, multiple vertically-alternating tiers of conductive material and insulative material of such circuitry may be below a lowest of the wordline tiers 22 and/or above an uppermost of the wordline tiers 22. Regardless, wordline tiers 22 may not comprise conductive material and insulative tiers 20 may not comprise insulative material or be insulative at this point in processing. Example wordline tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial. Only one stack 18 is shown although more than one stack 18 may be above or below (not shown) stack 18 above or below substrate 11.

Figure 7:
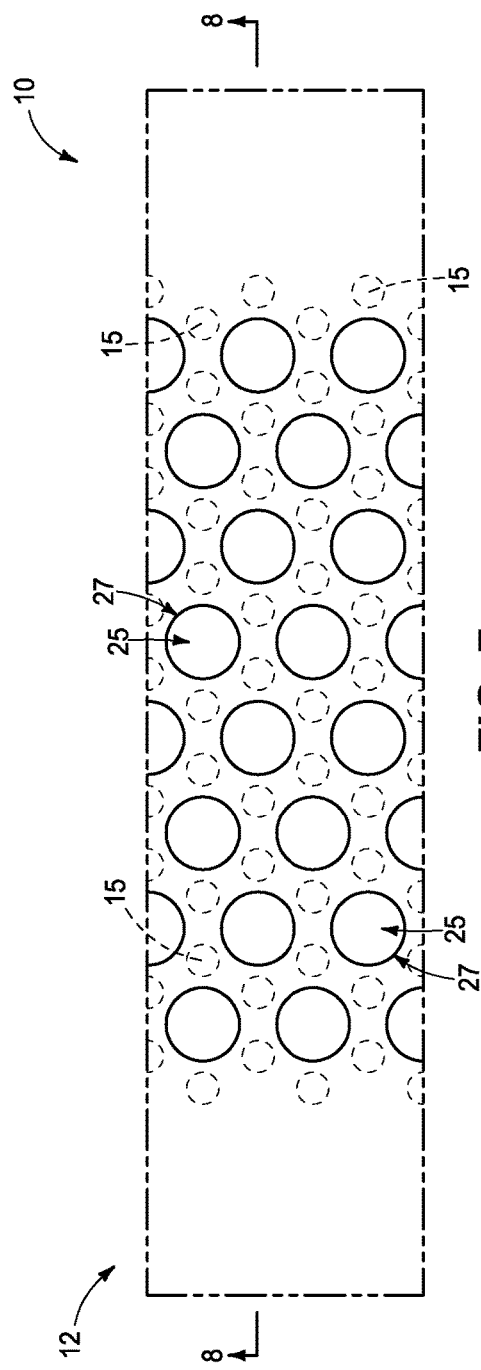
Figure 8:
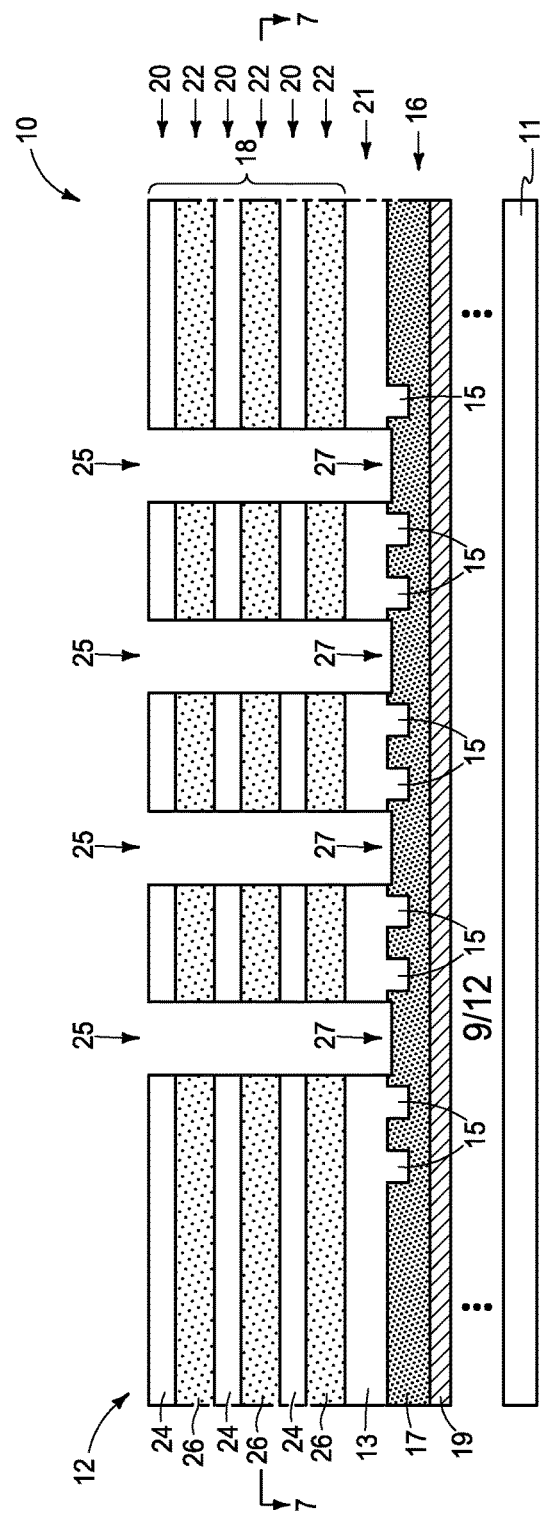

Referring to FIGS. 7 and 8, channel openings 25 have been etched through insulative tiers 20 and wordline tiers 22 in string locations 27. In one embodiment, channel openings having been etched into, and in one such embodiment through, insulator tier 21. Channel openings 25 (and strings subsequently formed therein as described below) may or may not extend into conductive tier 16. In one embodiment, a sacrificial plug (e.g., elemental tungsten and not shown) may be formed initially to extend through conductive tier 16 in string locations 27. Channel openings 25 may be formed thereto and ideally to stop on or within such sacrificial plugs. Thereafter, such sacrificial plugs may be removed (e.g., by selective etching relative to other exposed materials) thereby leaving a void space (not shown) after such act of removing. Channel openings 25, in such embodiment, may thereby effectively be extended through such individual void spaces to stop on or at least proximate to an uppermost surface of conductive tier 16.

Transistor channel material is formed in the individual channel openings elevationally along the insulative tiers and the wordline tiers and is directly electrically coupled with conductive material in the conductive tier. Individual memory cells of the array being formed may comprise a gate region (e.g., a control-gate region) and a memory structure laterally between the gate region and the channel material. In one such embodiment, the memory structure is formed to comprise a charge-blocking region, storage material (e.g., charge-storage material), and insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a bandgap-engineered structure having nitrogen containing material [e.g., silicon nitride] sandwiched between two insulator oxides [e.g., silicon dioxide]) is laterally between the channel material and the storage material.

Figure 9:
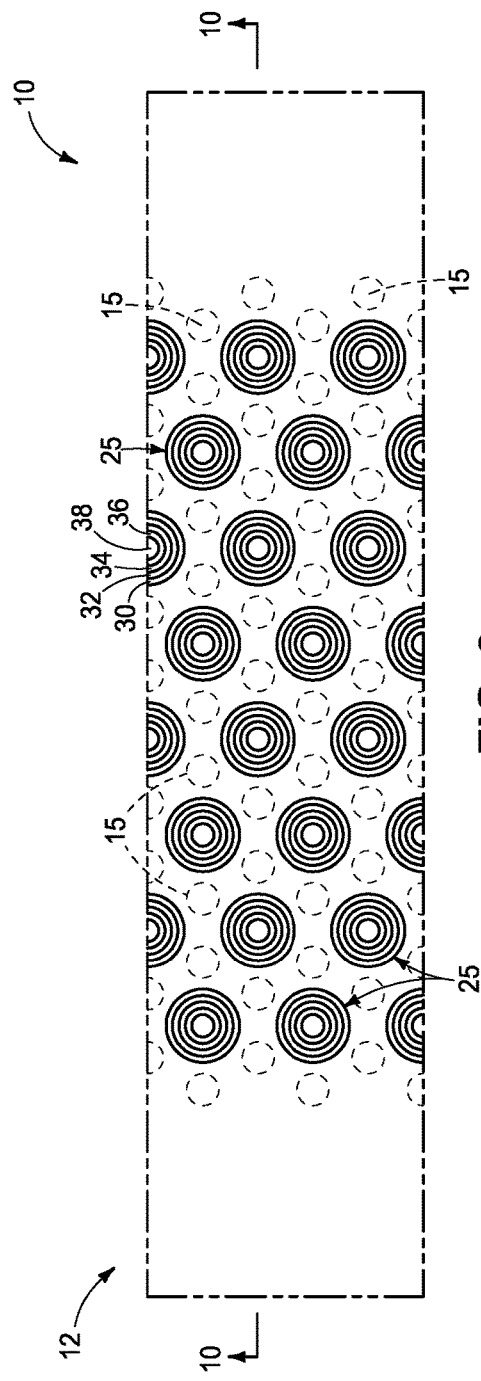
Figure 10:
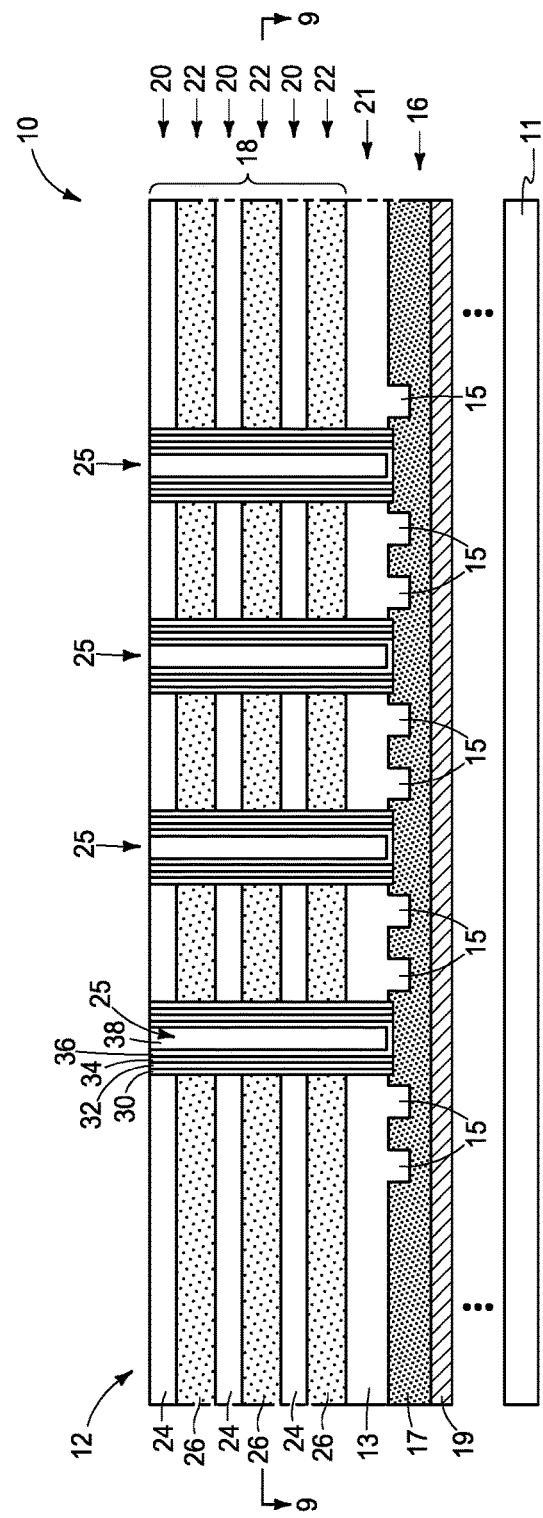

FIGS. 9 and 10 show one embodiment wherein charge-blocking material 30, storage material 32, and charge-passage material 34 have been formed in individual channel openings 25 elevationally along insulative tiers 20 and wordline tiers 22. Transistor materials 30, 32 and 34 (e.g., memory cell materials) may be formed by, for example, deposition of respective thin layers thereof over stack 18 and within individual channel openings 25 followed by planarizing such back at least to an uppermost surface of stack 18. Channel material 36 has been formed in channel openings 25 elevationally along insulative tiers 20 and wordline tiers 22. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductive tier 16 such that channel material 36 is directly against conductive material 19 of conductive tier 16. Alternately, and by way of example only, no punch etching may be conducted and channel material 36 may be directly electrically coupled to material 19 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Figure 11:
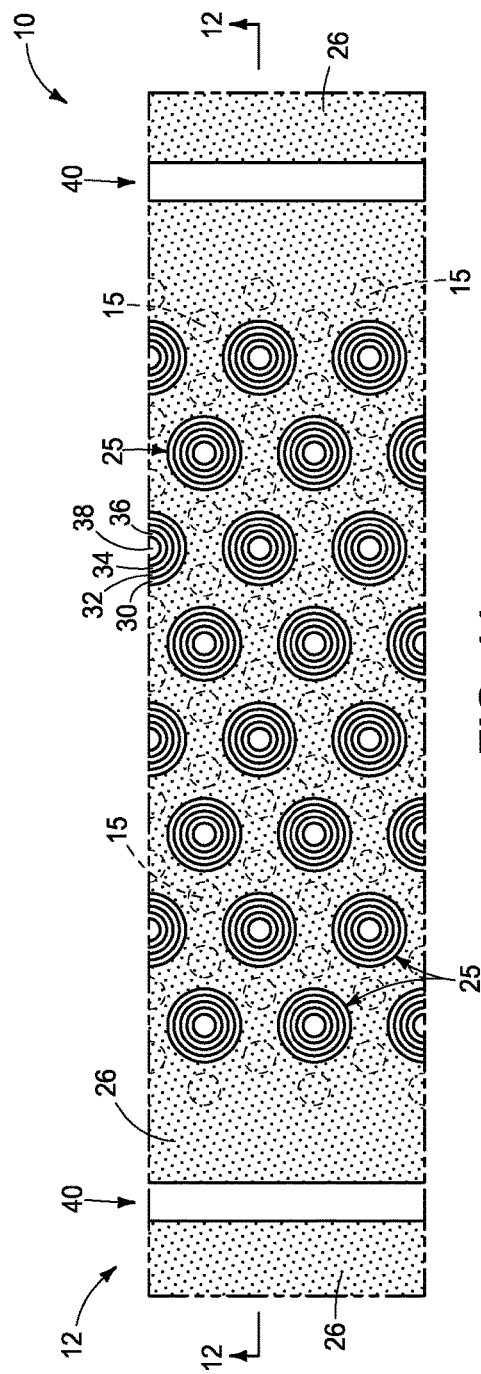
Figure 12:
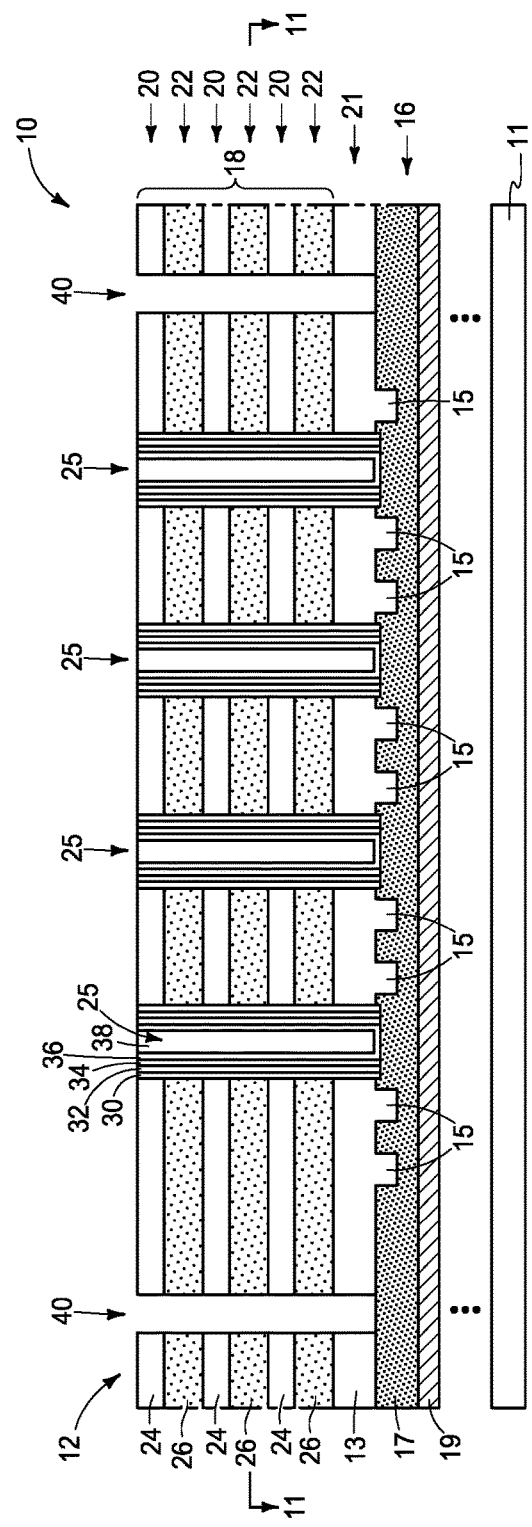

Referring to FIGS. 11 and 12, horizontally-elongated trenches 40 have been formed (e.g., by anisotropic etching) through stack 18 to conductive tier 16.

Figure 13:
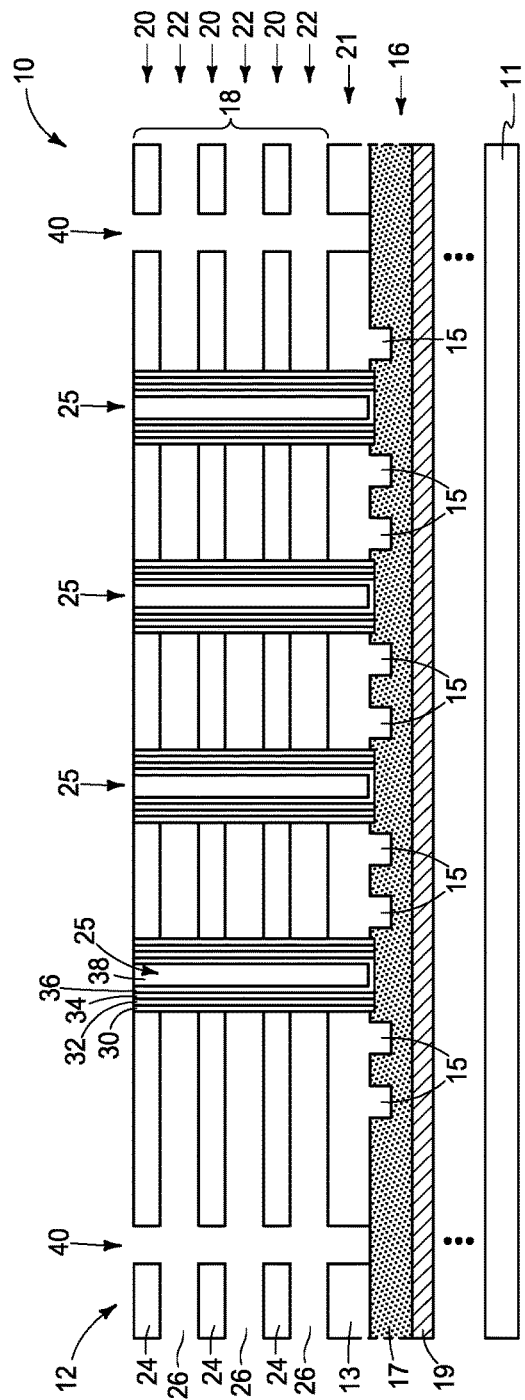

Referring to FIG. 13, material 26 (not shown) of wordline tiers 22 has been etched selectively relative to materials 24, 30, 32, 34, 36, and 38 (e.g., using liquid or vapor $H_3PO_4$ as a primary etchant where material 26 is silicon nitride, material 24 is silicon dioxide).

Figure 14:
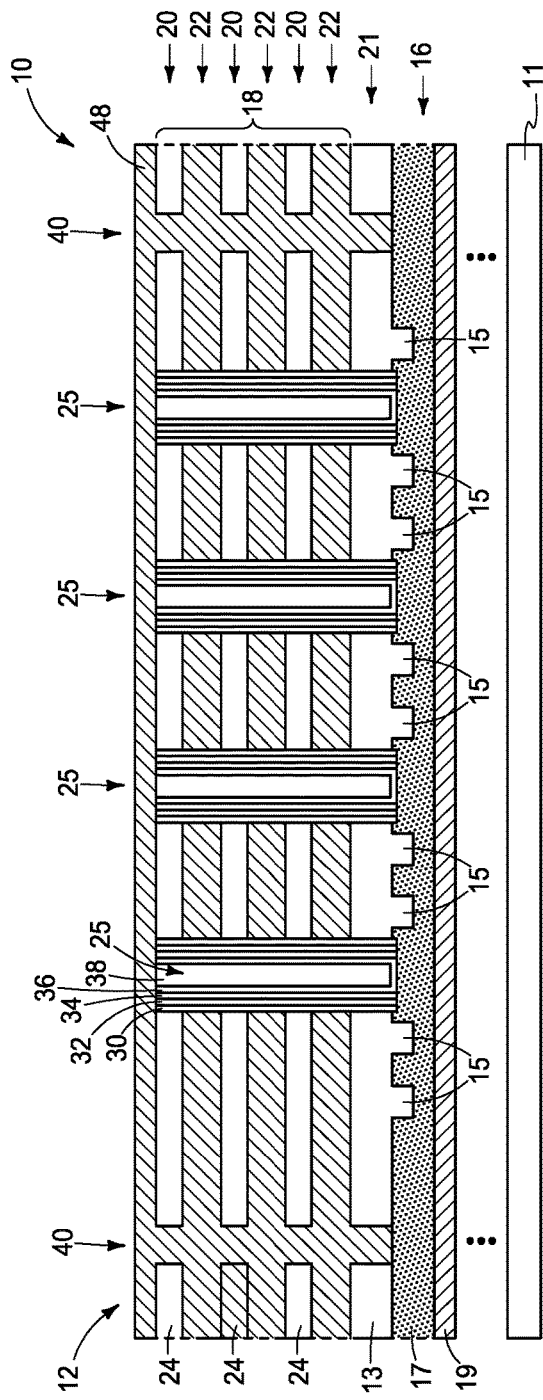

Conducting material is ultimately formed into wordline tiers 22 and which will comprise conducting material of the individual wordlines to be formed. FIG. 14 shows such an example embodiment wherein conducting material 48 has been formed into wordline tiers 22 through trenches 40. Any suitable conducting material 48 may be used, for example one or both of metal material and/or conductively-doped semiconductive material. In but one example embodiment, conducting material 48 comprises a first-deposited conformal titanium nitride liner (not shown) followed by deposition of another composition metal material (e.g., elemental tungsten).

Figure 17:
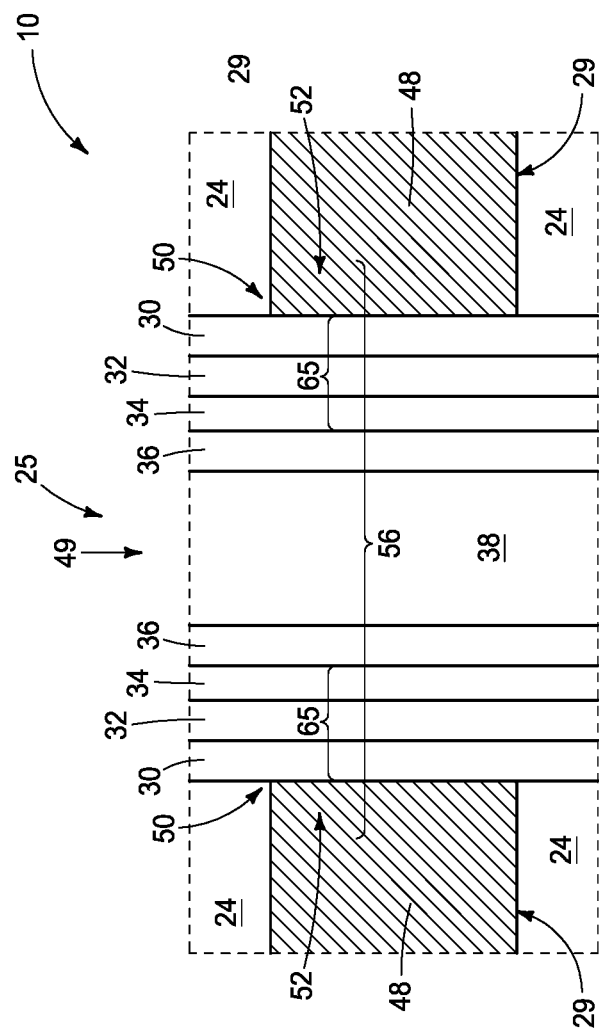

Referring to FIGS. 15-17, conducting material 48 has been removed from individual trenches 40. Such has resulted in formation of wordlines 29 and elevationally-extending strings 49 of individual transistors and/or memory cells 56. Approximate locations of transistors and/or memory cells 56 are indicated with a bracket in FIG. 17 and some with dashed outlines in FIGS. 15 and 16, with transistors and/or memory cells 56 being essentially ring-like or annular in the depicted example. Conducting material 48 may be considered as having terminal ends 50 (FIG. 17) corresponding to control-gate regions 52 of individual transistors and/or memory cells 56. Control-gate regions 52 in the depicted embodiment comprise individual portions of individual wordlines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 18:
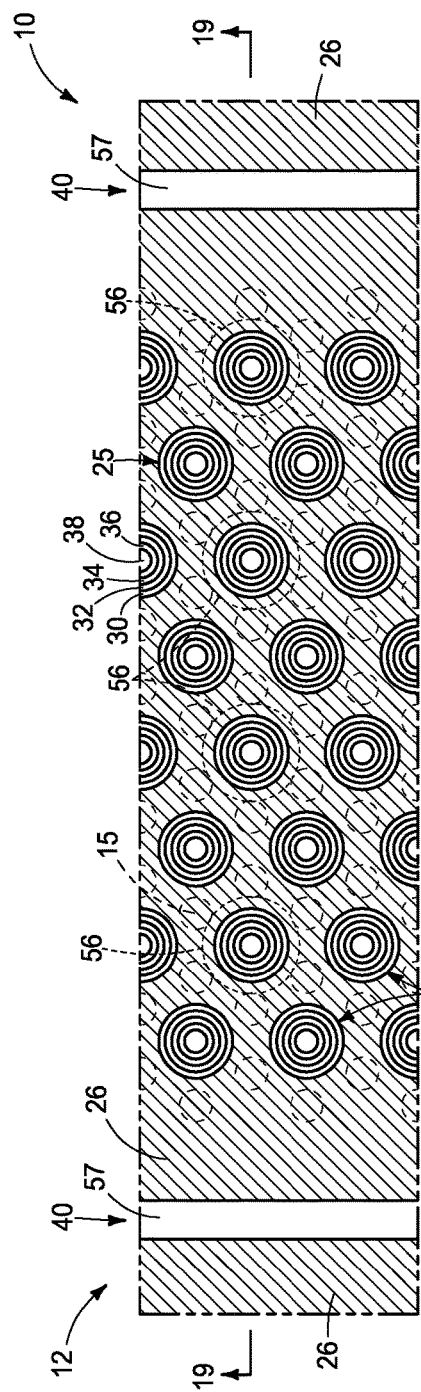
Figure 19:
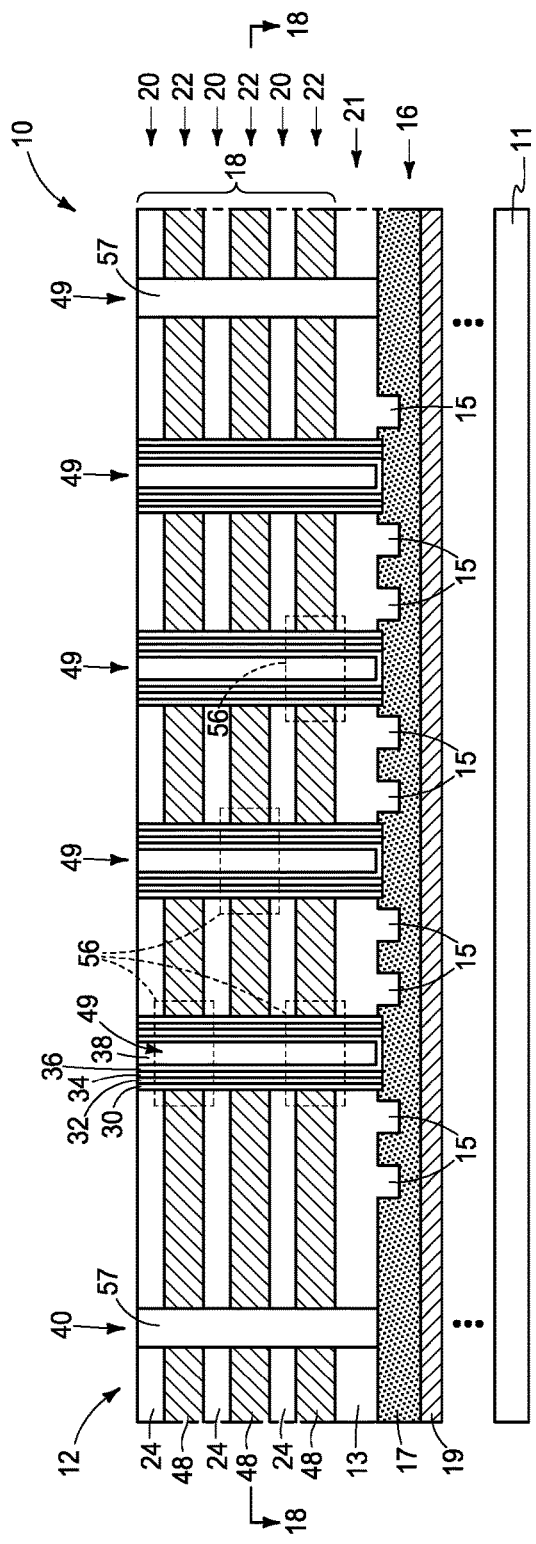

Referring to FIGS. 18 and 19, a material 57 (dielectric and/or silicon-containing such as undoped polysilicon) has been formed in individual trenches 40.

Any other attribute(s) or aspect(s) as shown and/or described herein with respect to other embodiments may be used with respect to the above-described embodiments.

Openings 15 having material 13 therein may provide an anchoring function to restrict or preclude any tendency of stack 18 and/or tier 21 from delaminating from conductive tier 16. In some predecessor constructions, strings 49 were used to provide such an anchoring function typically by being formed into conductive tier 16. In some instances, it is desirable that strings 49 extend very little, or not at all, into conductive tier 16. In such instances, openings 15 and material 13 therein may provide sufficient anchoring function whereby strings 49 need not provide any such anchoring function.

The above example embodiment shows openings 15 in conductive tier 16 with insulator material 13 therein as comprising vertical sidewalls (e.g., in one embodiment that are continuously vertical from top to bottom of individual openings 15). Alternately, vertical or other orientated sidewalls may be used which have a step (not shown) somewhere between an uppermost surface and lowermost surface of conductive tier 16. Additionally, openings 15 in conductive tier 16 in insulator material 13 therein may be wider at their respective bottoms than at their respective tops or wider at their respective tops than at their respective bottoms. Example such embodiment constructions 10a and 10b, respectively, having openings 15a and 15b, respectively, are shown in FIGS. 20 and 21, respectively. Like numerals from the above-described embodiments have been used where appropriate, with some construction differences being indicated with the suffix "a" and "b", respectively. Any other attribute(s) or aspect(s) as shown and/or described herein with respect to other embodiments may be used.

Embodiments of the invention encompass memory arrays independent of method of manufacture. Nevertheless, such memory arrays may have any of the attributes as described herein in method embodiments. Likewise, the above-described method embodiments may incorporate and form any of the attributes described with respect to device embodiments.

In one embodiment, a memory array (e.g., 12) comprises a conductive tier (e.g., 16) comprising openings (e.g., 15) therein. An insulating tier (e.g., 21) is atop the conductive tier and comprises insulator material (e.g., 13) that extends downwardly into the openings in the conductive tier. A stack (e.g., 18) comprising vertically-alternating insulative tiers (e.g., 20) and wordline tiers (e.g., 22) is above the insulator tier. Strings (e.g., 49) comprising channel material (e.g., 36) extend through the insulative tiers and the wordline tiers. The channel material of the strings is directly electrically coupled to conductive material (e.g., 17/19) in the conductive tier. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprises forming a conductive tier atop a substrate, with the conductive tier comprising openings therein. An insulator tier is formed atop the conductive tier and the insulator tier comprises insulator material that extends downwardly into the openings in the conductive tier. A stack comprising vertically-alternating insulative tiers and wordline tiers is formed above the insulator tier. Strings comprising channel material that extend through the insulative tiers and the wordline tiers are formed. The channel material of the strings is directly electrically coupled to conductive material in the conductive tier.

In some embodiments, a method used in forming a memory array comprises forming conductive material of a conductive tier atop a substrate. Openings are etched into the conductive material and the openings are grouped around individual string locations. An insulator tier is formed atop the conductive tier and comprises insulator material that extends downwardly into the openings in the conductive material of the conductive tier. A stack comprising vertically-alternating insulative tiers and wordline tiers is formed above the insulator tier. Strings comprising channel material extend through the insulative tiers and the wordline tiers and into the insulator tier in the string locations. The channel material of the strings is directly electrically coupled to the conductive material in the conductive tier.

In some embodiments, a memory array comprises a conductive tier comprising openings therein. An insulator tier is atop the conductive tier and the insulator tier comprises insulator material that extends downwardly into the openings in the conductive tier. A stack comprising vertically-alternating insulative tiers and wordline tiers is above the insulator tier. Strings comprising channel material extend through the insulative tiers and the wordline tiers. The channel material of the strings is directly electrically coupled to conductive material in the conductive tier.

In some embodiments, a memory array comprises a conductive tier comprising openings therein. An insulator tier is atop the conductive tier and comprises insulator material that extends downwardly into and completely fills the openings in the conductive tier. A stack comprising vertically-alternating insulative tiers and wordline tiers is above the insulator tier. Strings comprising channel material extend through the insulative tiers and the wordline tiers and into the insulator tier. The channel material of the strings is directly electrically coupled to conductive material in the conductive tier. The strings are everywhere laterally spaced from the openings in the conductive tier and the insulator material therein. The strings comprising the channel material extend elevationally through the insulative tiers and the wordline tiers. Insulative charge-passage material is in the wordline tiers laterally outward of the channel material. A storage region is in the wordline tiers laterally outward of the insulative charge-passage material. A charge-blocking region is in the wordline tiers laterally outward of the storage region. Multiple of the openings in the conductive tier and the insulator material therein are laterally outward of individual of the strings and said multiple surround the individual strings and are at least 3 in number. Said multiple are shared by immediately laterally adjacent of the individual strings.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array, comprising:
   forming a conductive tier atop a substrate, the conductive tier comprising openings therein;
   forming an insulator tier atop the conductive tier, the insulator tier comprising insulator material that extends downwardly into the openings in the conductive tier;
   forming a stack comprising vertically-alternating insulative tiers and wordline tiers above the insulator tier;
   forming strings comprising channel material through the insulative tiers and the wordline tiers, the channel material of the strings being directly electrically coupled to conductive material in the conductive tier; and
   multiple of the openings in the conductive tier and the insulator material therein being laterally spaced relative one another circumferentially around individual of the strings in a horizontal cross-section.

2. The method of claim 1 wherein the forming of the conductive tier and openings therein comprises:
   depositing the conductive material atop the substrate; and
   etching the openings into the deposited conductive material.

3. The method of claim 1 wherein the insulator material completely fills the openings in the conductive tier.

4. The method of claim 1 wherein the openings in the conductive tier and the insulator material therein comprise vertical sidewalls.

5. The method of claim 1 wherein the openings in the conductive tier and the insulator material therein are wider at their respective bottoms than at their respective tops.

6. The method of claim 1 wherein the openings in the conductive tier and the insulator material therein are wider at their respective tops than at their respective bottoms.

7. The method of claim 1 wherein,
   the strings comprise:
      the channel material extending elevationally through the insulative tiers and the wordline tiers;
      insulative charge-passage material in the wordline tiers laterally outward of the channel material;
      a storage region in the wordline tiers laterally outward of the insulative charge-passage material; and
      a charge-blocking region in the wordline tiers laterally outward of the storage region.

8. The method of claim 1 wherein said multiple are shared by immediately laterally adjacent of the individual strings.

9. The method of claim 1 wherein said multiple are equally spaced circumferentially around the individual strings.

10. The method of claim 1 wherein said multiple are at least 4 in number.

11. The method of claim 10 wherein said multiple are at least 6 in number.

12. The method of claim 11 wherein said multiple are only 6 in number.

13. The method of claim 12 wherein,
   said multiple are equally spaced around the individual strings; and
   said multiple are shared by immediately laterally adjacent of the individual strings.

14. The method of claim 1 wherein the insulator material does not extend through the conductive tier.

15. The method of claim 14 wherein the conductive tier has a maximum thickness of greater that 600 Angstroms, the insulator material extending through no less than 600 Angstroms of the conductive tier.

16. The method of claim 14 wherein the insulator material extends through no more than 50% of maximum thickness of the conductive tier.

17. The method of claim 1 wherein the strings are everywhere laterally spaced from the openings in the conductive tier and the insulator material therein.

18. The method of claim 1 comprising forming and removing a sacrificial plug that extends through the insulator tier, the individual strings extending through void space that is left after said removing.

19. The method of claim 1 wherein the strings extend through the insulator tier.

20. The method of claim 1 wherein the strings extend through the insulator tier and into the conductive tier.

21. The method of claim 1 wherein the channel material of the channel material strings is directly against the conductive material in the conductive tier.

22. The method of claim 1 wherein the strings extend into the insulator tier.

23. A method used in forming a memory array, comprising:
   forming conductive material of a conductive tier atop a substrate;
   etching openings into the conductive material, multiple of the openings being grouped circumferentially around individual string locations in a horizontal cross-section;
   forming an insulator tier atop the conductive tier, the insulator tier comprising insulator material that extends downwardly into the openings in the conductive material of the conductive tier;
   forming a stack comprising vertically-alternating insulative tiers and wordline tiers above the insulator tier; and
   forming strings comprising channel material through the insulative tiers and the wordline tiers and into the insulator tier in the string locations, the channel material of the strings being directly electrically coupled to the conductive material in the conductive tier.

24. The method of claim 23 wherein the grouped openings and insulator material therein are equally spaced around the individual string locations and around the individual strings.

25. A memory array comprising:
   a conductive tier comprising openings therein;
   an insulator tier atop the conductive tier, the insulator tier comprising insulator material that extends downwardly into the openings in the conductive tier, multiple of the openings in the conductive tier and the insulator material therein being laterally spaced relative one another circumferentially around individual of the strings in a horizontal cross-section;
   a stack comprising vertically-alternating insulative tiers and wordline tiers above the insulator tier; and
   strings comprising channel material extending through the insulative tiers and the wordline tiers, the channel material of the strings being directly electrically coupled to conductive material in the conductive tier.

26. The memory array of claim 25 wherein the insulator material completely fills the openings in the conductive tier.

27. A memory array comprising:
   a conductive tier comprising openings therein;
   an insulator tier atop the conductive tier, the insulator tier comprising insulator material that extends downwardly into and completely fills the openings in the conductive tier, multiple of the openings in the conductive tier and the insulator material therein being laterally spaced relative one another circumferentially around individual of the strings in a horizontal cross-section;
   a stack comprising vertically-alternating insulative tiers and wordline tiers above the insulator tier;
   strings comprising channel material extending through the insulative tiers and the wordline tiers and into the insulator tier, the channel material of the strings being directly electrically coupled to conductive material in the conductive tier, the strings being everywhere laterally spaced from the openings in the conductive tier and the insulator material therein, the strings comprising:
      the channel material extending elevationally through the insulative tiers and the wordline tiers;
      insulative charge-passage material in the wordline tiers laterally outward of the channel material;
      a storage region in the wordline tiers laterally outward of the insulative charge-passage material; and
      a charge-blocking region in the wordline tiers laterally outward of the storage region; and
   said multiple being at least 3 in number; said multiple are shared by immediately laterally adjacent of the individual strings.

28. A method used in forming a memory array, comprising:
   forming conductive material of a conductive tier atop a substrate;
   etching openings into the conductive material, the openings being grouped around individual string locations;
   forming an insulator tier atop the conductive tier, the insulator tier comprising insulator material that extends downwardly into the openings in the conductive material of the conductive tier;
   forming a stack comprising vertically-alternating insulative tiers and wordline tiers above the insulator tier; and
   forming strings comprising channel material through the insulative tiers and the wordline tiers and into the insulator tier in the string locations, the channel material of the strings being directly electrically coupled to the conductive material in the conductive tier;
   wherein the grouped openings and insulator material therein are equally spaced around the individual string locations and around individual of the strings; and
   wherein, relative to being grouped, the openings and insulator material therein in individual of the groups are shared by immediately laterally adjacent of the individual groups.

29. A memory array comprising:
   a conductive tier comprising openings therein;
   an insulator tier atop the conductive tier, the insulator tier comprising insulator material that extends downwardly into the openings in the conductive tier, the openings in the conductive tier and the insulator material therein being laterally spaced relative one another in a horizontal cross-section;
   a stack comprising vertically-alternating insulative tiers and wordline tiers above the insulator tier;
   strings comprising channel material extending through the insulative tiers and the wordline tiers, the channel material of the strings being directly electrically coupled to conductive material in the conductive tier;
   wherein,
   the strings comprise:
      the channel material extending elevationally through the insulative tiers and the wordline tiers;
      insulative charge-passage material in the wordline tiers laterally outward of the channel material;

a storage region in the wordline tiers laterally outward of the insulative charge-passage material; and a charge-blocking region in the wordline tiers laterally outward of the storage region; and multiple of the openings in the conductive tier and the insulator material therein are laterally outward of individual of the strings;

wherein said multiple surround the individual strings and are at least 3 in number; and wherein relative to surround, said multiple are shared by immediately laterally adjacent of the individual strings.

\* \* \* \* \*